US007812349B2

(12) United States Patent
Yuki et al.

(10) Patent No.: US 7,812,349 B2
(45) Date of Patent: Oct. 12, 2010

(54) DISPLAY APPARATUS

(75) Inventors: Osamu Yuki, Tokyo (JP); Yoshinori Nakajima, Kanagawa (JP); Shigeki Kondo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/425,459

(22) Filed: Apr. 17, 2009

(65) Prior Publication Data

US 2009/0203157 A1 Aug. 13, 2009

Related U.S. Application Data

(62) Division of application No. 11/503,966, filed on Aug. 15, 2006, now Pat. No. 7,537,946, which is a division of application No. 10/909,388, filed on Aug. 3, 2004, now Pat. No. 7,119,367.

(30) Foreign Application Priority Data

| | | |
|---|---|---|
| Aug. 7, 2003 | (JP) | 2003-288401 |
| Aug. 7, 2003 | (JP) | 2003-288520 |
| Jul. 29, 2004 | (JP) | 2004-221606 |

(51) Int. Cl.
*H01L 29/04* (2006.01)

(52) U.S. Cl. .............................. 257/59; 257/72; 257/79

(58) Field of Classification Search ................... 257/59, 257/72, 79

See application file for complete search history.

(56) References Cited

U.S. PATENT DOCUMENTS 5,990,629 A 11/1999 Yamada et al. ........... 315/169.3

(Continued)

FOREIGN PATENT DOCUMENTS

JP 63-280300 11/1988

(Continued)

OTHER PUBLICATIONS

C. W. Tang, et al., "Electroluminescence of Doped Organic Thin Films", J. Applied Physics, vol. 65, No. 9, pp. 3610-3616 (May 1, 1989).

(Continued)

*Primary Examiner*—Long Pham
(74) *Attorney, Agent, or Firm*—Fitzpatrick, Cella, Harper & Scinto

(57) ABSTRACT

An image display apparatus includes a display unit and a voltage source, with the display unit having display devices and pixel circuits. Each of the pixel circuits is provided with a drive transistor which has a first primary electrode connected to one terminal of each of the display devices, a second primary electrode connected to a first common electrode, and a control electrode for controlling by an electric potential the magnitude of a drive current supplied to the display devices. In addition, and a control transistor has a source electrode and a drain electrode connected to the control electrode and the first primary electrode, respectively, and a gate electrode to which a signal switching between an on-state and an off-state is supplied, with an electric potential of the control electrode being set up at the on-state. The voltage source can adjust a voltage applied between the first common electrode and a second common electrode with another terminal of the display device being connected thereto.

4 Claims, 9 Drawing Sheets

U.S. PATENT DOCUMENTS

| | | | | |
|---|---|---|---|---|
| 6,229,506 | B1 | 5/2001 | Dawson et al. | |
| 7,119,367 | B2 | 10/2006 | Yuki et al. | 257/59 |
| 7,362,322 | B2 | 4/2008 | Kimura et al. | |
| 2002/0135309 | A1 | 9/2002 | Okuda | |
| 2002/0180721 | A1 | 12/2002 | Kimura et al. | |
| 2003/0122813 | A1 | 7/2003 | Ishizuki et al. | |

FOREIGN PATENT DOCUMENTS

| | | | |
|---|---|---|---|
| JP | 10-232649 | | 9/1998 |
| JP | 2001-56667 | | 2/2001 |
| JP | 2002-23666 | | 1/2002 |
| JP | 2002-514320 | A | 5/2002 |
| JP | 2002-215095 | A | 7/2002 |
| JP | 2003-202837 | A | 7/2003 |
| WO | 98/40871 | A1 | 9/1998 |
| WO | 98/48403 | A1 | 10/1998 |

OTHER PUBLICATIONS

C.W. Tang, et al., “Organic Electroluminescent Diodes”, Applied Physics Letter, vol. 51, No. 12, pp. 913-915 (Sep. 21, 1987).

DISPLAY APPARATUS

This application is a divisional of application Ser. No. 11/503,966, filed on Aug. 15, 2006, now U.S. Pat. No. 7,537,946, issued on May 26, 2009, which is a divisional of application Ser. No. 10/909,388, filed on Aug. 3, 2004, now U.S. Pat. No. 7,119,367, issued on Oct. 10, 2006.

This application claims priority from Japanese Patent Applications No. 2003-288401 filed Aug. 7, 2003, No. 2003-288520 filed Aug. 7, 2003 and No. 2004-221606 filed Jul. 29, 2004, which are hereby incorporated by reference herein.

BACKGROUND OF THE INVENTION

1. Field of the Invention

The present invention relates to a display apparatus. In particular, the present invention relates to a display apparatus including a plurality of pixel circuits each having display devices, transistors for drive and transistors for control.

2. Description of Related Art

A method for performing a drive with a constant electric current is known as a drive circuit. For example, as a light emitting device suitable for being driven by an electric current, a light emitting device (hereinafter referred to as an LED), an organic electroluminescent device (hereinafter referred to as an organic EL device or as an OEL device), and the like can be cited. The characteristics of these light emitting devices scarcely depend on temperature, and an emission intensity curve almost linear to an electric current can be obtained. Consequently, a method of a constant electric current drive has been proposed.

In the following, an organic EL device is exemplified, and a conventional electric current drive for light emission is described.

The organic EL device is featured by planer self emitting light from a thin film stocked layer capable of high intensity emission. The organic EL device can realize high efficient light emission at a low voltage by increasing the number of function stacked layers of organic layers, see "Applied Physics Letters", U.S., 1987, Vol. 51, p. 913, "Applied Physics Letters", U.S. 1989, Vol. 65, p. 3610. As described above, because the organic EL device is driven to emit light by a constant electric current, some constant electric current driving schemes have been proposed.

For example, a drive circuit as shown in FIG. 3 has proposed in Japanese Patent Application Laid-Open No. 2001-056667 and U.S. Pat. No. 6,229,506. The drive circuit copies an input electric current (idata) to supply the electric current to OEL 13. The drive method is an electric current control type method of using an electric current as an input to set the electric potential of the control electrode of a transistor 11. The method has a technical advantage of the capability of supplying a substantially same electric current as an input electric current to the OEL 13 without being affected by the threshold value of the transistor 11 and a deteriorated voltage of the OEL 13.

Moreover, Japanese Patent Application Laid-Open No. S63-280300 discloses an information display apparatus arranging a plurality of display dots therein. Each of the display dots composed of collected light emitting diodes having different luminance colors. In particular, Japanese Patent Application Laid-Open No. S63-280300 discloses a configuration including a power supply for supplying a voltage to the light emitting diodes per each luminance color.

Moreover, Japanese Patent Application Laid-Open No. 2002-23666 discloses a plurality of configurations of an electronic display apparatus using cathode common type LED's emitting a plurality of color beams. One of the configurations uses an independent switching power supply outputting different DC voltages to respective colors. The other configuration uses a combination of simple power supply circuits for voltage adjustment.

Moreover, Japanese Patent Application Laid-Open No. H10-232649 discloses a configuration in which selection transistors and drive transistors are controlled by binary signals of on/off respectively, and in which peculiar voltage values or electric current values are variably output from a variable drive power supply during each sub-frame period.

SUMMARY OF THE INVENTION

It is a subject of the present invention to realize a display apparatus capable of realizing high grade display.

A first aspect of the present invention is a manufacturing method of an image display apparatus including the steps of:

preparing a display unit; and adjusting an electric potential to be applied to the display unit; wherein the display unit includes:

a plurality of wirings for a scanning signal;

a plurality of wirings for a modulation signal; and a plurality of pixel circuits connected to be in a matrix connection with the plurality of wirings for a scanning signal and the plurality of wirings for a modulation signal; and wherein each of the plurality of pixel circuits includes:

a display device;

a transistor for drive having a control electrode and two primary electrodes; and a transistor for control having a control electrode and two primary electrodes, wherein the transistor of drive is configured so that one of the two primary electrodes is connected to the display device to flow a drive electric current, which should be flown into the display device, through the transistor of drive between the two primary electrodes thereof, and the transistor for control is configured so that one of the primary electrodes is connected to the control electrode of the transistor for drive, and that the transistor for control switches a state of the transistor for drive between a state of setting up an electric potential of the control electrode of the transistor for drive and a state of holding the set electric potential in accordance with the scanning signal to be applied to the control electrode through the wiring for the scanning signal; and the display unit further includes:

a first common electrode, to which one primary electrode of the two primary electrodes of the transistor for drive is commonly connected, the one primary electrode being not the primary electrode connected to the display device in each of at least a part of the plurality of pixel circuits; and a second common electrode, to which an electric potential different from an electric potential applied to the first common electrode is applied, for commonly applying the former electric potential to the display device of the part or all of the plurality of pixel circuits; wherein the step of adjusting an electric potential is a step of adjusting an electric potential which an electric potential source for applying the electric potential to the first common electrode can output to bring the electric potential near to one to be applied to the second common electrode.

A second aspect of the present invention is a manufacturing method of an image display apparatus having the steps of:

preparing a display unit; and adjusting an electric potential to be applied to the display unit; wherein the display unit includes:

a plurality of wirings for a scanning signal;

a plurality of wirings for a modulation signal; and a plurality of pixel circuits connected to be in a matrix connection with the plurality of wirings for a scanning signal and the plurality of wirings for a modulation signal; and wherein each of the plurality of pixel circuits includes:

a display device;

a transistor for drive having a control electrode and two primary electrodes; and a transistor for control having a control electrode and two primary electrodes, wherein the transistor of drive is configured so that one of the two primary electrodes is connected to the display device to flow a drive electric current, which should be flown into the display device, through the transistor of drive between the two primary electrodes thereof, and the transistor for control is configured so that one of the primary electrodes is connected to the control electrode of the transistor for drive, and that the transistor for control switches a state of the transistor for drive between a state of setting up an electric potential of the control electrode of the transistor for drive and a state of holding the set electric potential in accordance with the scanning signal to be applied to the control electrode through the wiring for the scanning signal; and the display unit further includes:

a first common electrode, to which one primary electrode of the two primary electrodes of the transistor for drive is commonly connected, the one primary electrode being not the primary electrode connected to the display device in each of at least a part of the plurality of pixel circuits; and a second common electrode, to which an electric potential different from an electric potential applied to the first common electrode is applied, for commonly applying the former electric potential to the display device of the part or all of the plurality of pixel circuits; wherein the step of adjusting an electric potential is a step of adjusting an electric potential which an electric potential source for applying the electric potential to the second common electrode can output to bring the electric potential near to one to be applied to the first common electrode.

Incidentally, in the first aspect, it is preferable to set that the plurality of pixel circuits, in which the transistors for drive are commonly connected to the first common electrode, includes the display devices corresponding to a same color;

the plurality of pixel circuits connected to be in the matrix connection includes a plurality of pixel circuits each including display devices corresponding to a predetermined color different from the color;

the display unit further includes a third common electrode to which a primary electrode being not one to which the display device is connected between two primary electrodes of the transistor for drive in each of the plurality of pixel circuits including the display devices corresponding to the predetermined color; and the step of adjusting an electric potential includes a step of adjusting an electric potential which an electric potential source for applying an electric potential to the third common electrode to bring the electric potential near to an electric potential which should be applied to the second common electrode.

Incidentally, in the second aspect, it is preferable that the plurality of pixel circuits, to which the second electrode applies the electric potential, includes the display devices corresponding to a same color;

the plurality of pixel circuits connected to be in the matrix connection includes a plurality of pixel circuits each including display devices corresponding to a predetermined color different from the color;

the display unit further includes a fourth common electrode commonly applying an electric potential to a display device of each of the plurality of pixel circuits including the display devices corresponding to the predetermined color; and the step of adjusting an electric potential includes a step of adjusting an electric potential which an electric potential source for applying an electric potential to the fourth common electrode to bring the electric potential near to an electric potential which should be applied to the first common electrode.

Moreover, in the first or the second aspect, it is preferable that one of the two primary electrodes of the transistor for control, the primary electrode being not one connected to the control electrode of the transistor for drive, is connected to one of the two primary electrodes of the transistor for drive, the primary electrode is connected to the display device.

Moreover, a configuration in which the display element is an organic electroluminescence device can be preferably adopted in the first or the second aspect.

Moreover, another aspect of the present invention is an image display apparatus, comprising:

a plurality of wirings for a scanning signal;

a plurality of wirings for a modulation signal; and a plurality of pixel circuits connected to be in a matrix connection with the plurality of wirings for a scanning signal and the plurality of wirings for a modulation signal; and wherein each of the plurality of pixel circuits includes:

a display device;

a transistor for drive having a control electrode and two primary electrodes; and a transistor for control having a control electrode and two primary electrodes, wherein the transistor of drive is configured so that one of the two primary electrodes is connected to the display device to flow a drive electric current corresponding to a plurality of on-states different from each other of the display device through the transistor for drive between the two primary electrodes thereof, and the transistor for control is configured so that one of the primary electrodes is connected to the control electrode of the transistor for drive, and that the transistor for control switches a state of the transistor for drive between a state of setting up an electric potential of the control electrode of the transistor for drive and a state of holding the set electric potential in accordance with the scanning signal to be applied to the control electrode through the wiring for the scanning signal; and the plurality of pixel circuits includes first pixel circuits including the display devices corresponding to a predetermined color, and second pixel circuits including the display devices corresponding to a color different from the predetermined color;

the image display apparatus further includes:

a first common electrode, to which one primary electrode of the two primary electrodes of the transistor for drive is commonly connected, the one primary electrode being not the primary electrode connected to the display device in each of the first pixel circuits and the second pixel circuits; and a second common electrode, to which an electric potential different from an electric potential applied to the first common electrode is applied, for commonly applying the former electric potential to the display device of each of the first pixel circuits and the second pixel circuits;

a first electric potential source;

an adjustment circuit for adjusting an electric potential which the first electric potential source can generate to apply the adjusted electric potential to the first common electrode; and a second electric potential source for applying an electric potential to second common electrode, wherein the adjustment circuit is a circuit for adjusting the electric potential which the first electric source can generate to bring the electric potential near to the electric to be applied to the second common electrode.

Now, a configuration in which the second electric potential source is an electric potential source applying a ground potential, and a configuration in which the first electric potential source is a power supply apparatus for generating a predetermined electric potential.

Moreover, a further aspect of the present invention is an image display apparatus, comprising:

a plurality of wirings for a scanning signal;

a plurality of wirings for a modulation signal; and a plurality of pixel circuits connected to be in a matrix connection with the plurality of wirings for a scanning signal and the plurality of wirings for a modulation signal; and wherein each of the plurality of pixel circuits includes:

a display device;

a transistor for drive having a control electrode and two primary electrodes; and a transistor for control having a control electrode and two primary electrodes, wherein the transistor of drive is configured so that one of the two primary electrodes is connected to the display device to flow a drive electric current corresponding to a plurality of on-states different from each other of the display device through the transistor for drive between the two primary electrodes thereof, and the transistor for control is configured so that one of the primary electrodes is connected to the control electrode of the transistor for drive, and that the transistor for control switches a state of the transistor for drive between a state of setting up an electric potential of the control electrode of the transistor for drive and a state of holding the set electric potential in accordance with the scanning signal to be applied to the control electrode through the wiring for the scanning signal; and the plurality of pixel circuits includes first pixel circuits including the display devices corresponding to a predetermined color, and second pixel circuits including the display devices corresponding to a color different from the predetermined color;

the image display apparatus further includes:

a first common electrode, to which one primary electrode of the two primary electrodes of the transistor for drive is commonly connected, the one primary electrode being not the primary electrode connected to the display device in each of the first pixel circuits and the second pixel circuits; and a second common electrode, to which an electric potential different from an electric potential applied to the first common electrode is applied, for commonly applying the former electric potential to the display device of each of the first pixel circuits and the second pixel circuits;

a first electric potential source for applying an electric potential to the first common electrode;

a second electric potential source; and an adjustment circuit for adjusting an electric potential which the second electric potential source can generate to apply the adjusted electric potential to the second common electrode, wherein the adjustment circuit is a circuit for adjusting the electric potential which the second electric source can generate to bring the electric potential near to the electric to be applied to the first common electrode.

Now, a configuration in which the second electric potential source is an electric potential source applying a ground potential, and a configuration in which the first electric potential source is a power supply apparatus for generating a predetermined electric potential.

DESCRIPTION OF THE PREFERRED EMBODIMENTS

The present invention can be especially suitably applied to a configuration using self emitting light type display devices as display devices. To put it concretely, the present invention can be especially suitably applied to a configuration using electroluminescence display devices, especially suitably organic electroluminescence display devices. Moreover, the present invention can be especially suitably applied to a configuration in which each display device is driven by an active matrix drive.

Figure 6:
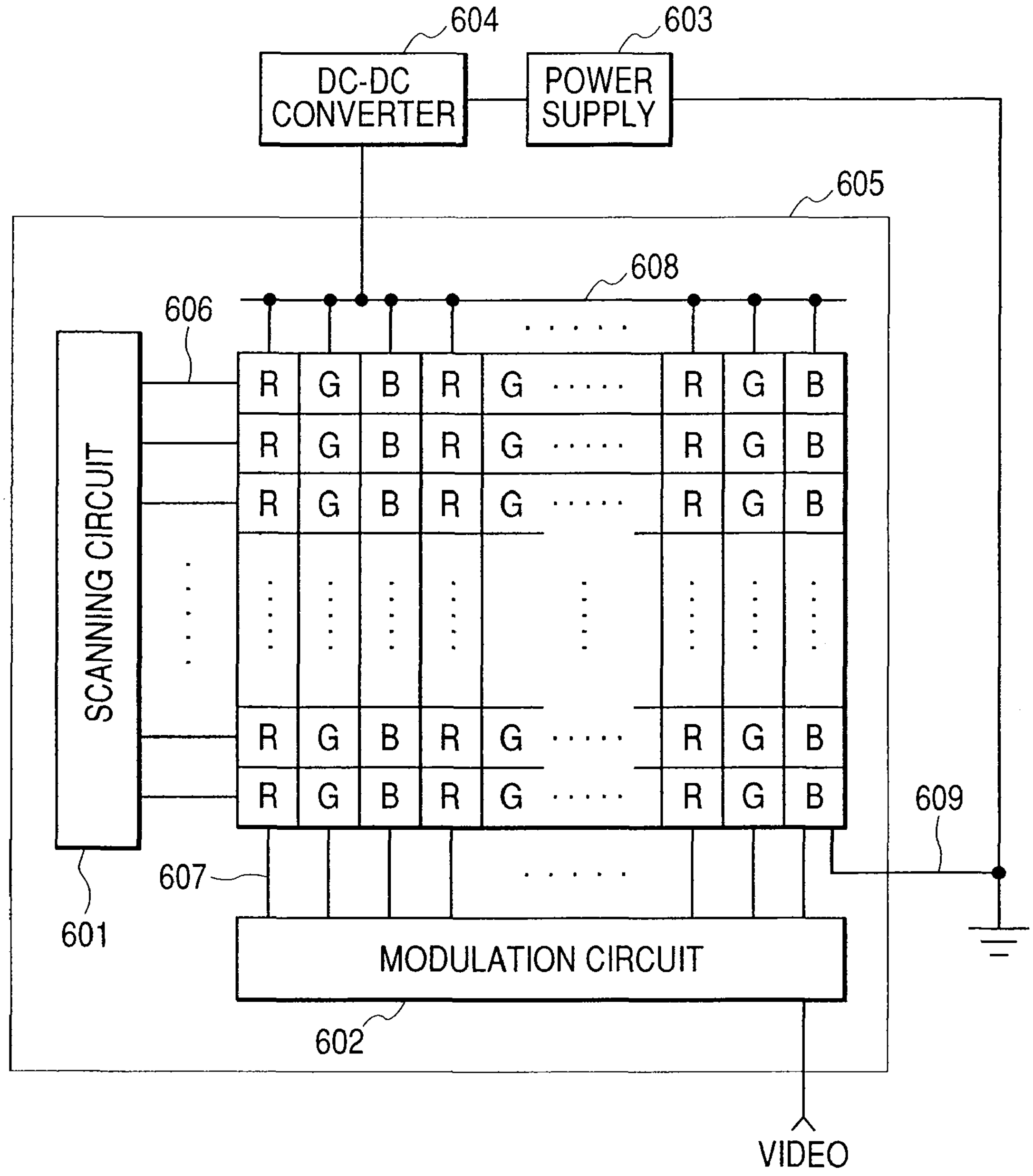
FIG. 6 is a diagram showing the configuration of the image display apparatus of an embodiment of the present invention.

The configuration of an image display apparatus of a first embodiment is shown in FIG. 6. In FIG. 6, a display unit 605 includes red pixel circuits (each denoted by a letter R in the drawing), green pixel circuits (each denoted by a letter G in the drawing), and blue pixel circuits (each denoted by a letter B in the drawing). Each pixel circuit severally includes an OEL device having one of red, green and blue luminance colors. Incidentally, FIG. 6 shows an example in which the pixel circuits are linearly arranged both in row directions and in column directions, but various arrangements such as one in which red, green and blue pixel circuits are triangularly arranged can be adopted.

Moreover, the display unit 605 includes a scanning circuit 601 and a modulation circuit 602. Each pixel circuit and the scanning circuit 601 are connected with each other by means of a scanning signal wiring 606. Each pixel circuit and the modulation circuit 602 are connected with each other by means of a modulation signal wiring 607. A scanning signal is applied to the pixel circuits on each row through the scanning signal wiring 606, and a modulation signal is applied to the pixel circuit on which the scanning signal is applied through the modulation signal wiring 607. Thereby, the light emitting state of each pixel circuit is set.

Moreover, an electric potential obtained by adjusting an electric potential which a power supply device 603 being a first electric potential source can output by means of a DC-DC converter 604 is commonly supplied to each pixel circuit through a first common electrode 608.

Moreover, an electric potential supplied from a ground unit being a second electric potential source is commonly supplied to each pixel circuit through a second common electrode 609.

Figure 3:
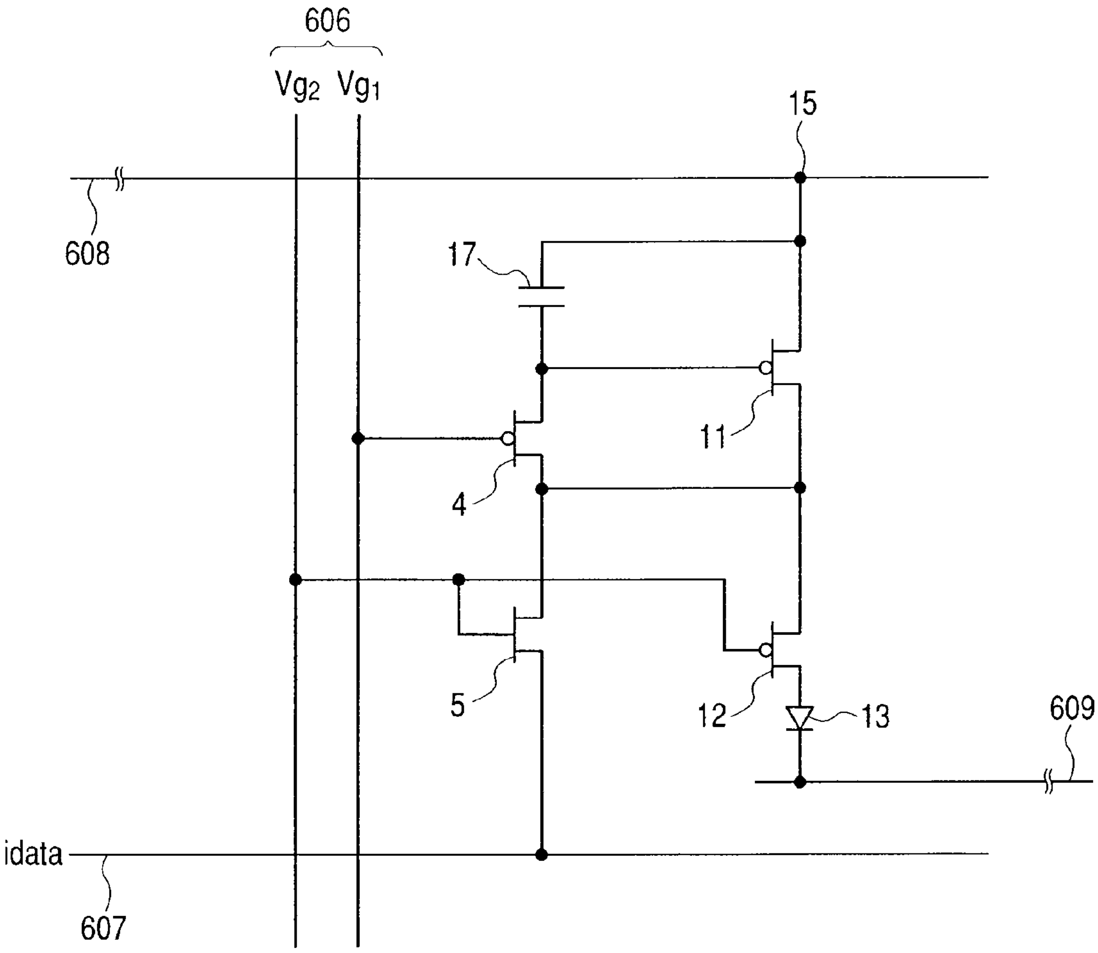
FIG. 3 is a schematic circuit diagram showing the configuration of an electric current setting type pixel circuit of the present invention.

A suitable form of each pixel circuit is shown in FIG. 3. Although the scanning signal wiring 606 is shown to be one to each pixel circuit in FIG. 6 for the same of a clear expression, it is suitable to connect at least two scanning signal wirings 606 to each pixel circuit in case of adopting an electric current programming type pixel circuit shown in FIG. 3. To put it concretely, it is suitable to use a scanning signal wiring 606 for supplying a scanning signal Vg1 to a transistor for control 4 of FIG. 3, and a scanning signal wiring 606 for applying a scanning signal Vg2 to a transistor 5 for setting up a signal writing timing and a transistor 12 for preventing an electric current from flowing through an OEL device 13 at the time of signal writing. Incidentally, the cathode electrode of the OEL device 13 being a display device is a solid electrode common to all pixels, which is connected to the second common electrode 609. The pixel circuit is configured to include a transistor for drive 11 for flowing a desired drive electric current into the display device, the display device 13 connected to the transistor for drive 11 in series between the first common electrode 608 and the second common electrode 609, and the transistor for control 4 connected to the control electrode of the transistor for drive 11 for switching the electric potential setting state and the electric potential holding state of the control electrode.

An electric potential for flowing a drive electric current corresponding to a plurality of on states between the two principal electrodes (source and drain) of the transistor for drive 11 is set up at the control electrode (gate) of the transistor for drive through the transistor for control 4. The plurality of on states does not mean switching between two values of on and off, but means a state of flowing a drive electric current of a certain value significant correspondingly to a modulation signal, and another state of flowing another drive electric current of another significant value.

As a configuration for setting up an electric potential corresponding to a modulation signal as the electric potential of the control electrode of a transistor for drive, a configuration in which a modulation signal wiring and the control electrode of the transistor for drive are connected to the two principal electrodes (the electrodes other than a control electrode and concretely corresponding to the source electrode and the drain electrode) of the transistor for control, respectively, wherein a modulation electric potential applied to a modulation signal through the transistor for control is written as an electric potential of the control electrode of the transistor for drive, can be adopted as a simpler configuration. The configuration is a voltage programming type configuration.

On the other hand, the example shown in FIG. 3 is an electric current programming type configuration. In the configuration, a modulation electric current signal (idata of FIG. 3) is applied to the modulation signal wiring 607. The electric current signal flowing through the modulation signal wiring 607 flows through the two principal electrodes of the transistor for drive 11. In addition, the transistor for control 4 functions as a path for setting up the electric potential at the control electrode of the transistor for drive 11, and the electric potential according to the modulation electric current flowing between the principal electrodes of the transistor for drive 11 is set up as the control electric potential of the control electrode of the transistor for drive 11.

In both of the voltage programming configuration and the electric current programming configuration, the transistor for control is turned off after the elapse of a voltage setting period, and the electric potential of the control electrode of the transistor for drive is kept. In this state, an electric current flowing between the principal electrodes of the transistor for drive flows through the display device, and thereby the display device emits light.

Incidentally, in both of the voltage programming configuration and the electric current programming configuration, when it is difficult to hold the electric potential of the control electrode of the transistor for drive only by the capacitance of the control electrode, it is suitable to use capacitance for holding the electric potential (corresponding to a hold capacitor 17 in FIG. 3) additionally.

In the configuration of holding the electric potential of the control electrode of the transistor for control by turning off the transistor for control as described above, a peculiar problem is generated.

In the following, the problem is concretely described by exemplifying the electric current programming configuration of FIG. 3. Incidentally, because thin film transistors are used as transistors in the preferred embodiments described later, transistors in the following description are notated as TFT's. Moreover, because organic electroluminescence devices are used in the preferred embodiments described later as display devices, the organic electroluminescence devices are notated as OEL's. In the present embodiment, polysilicon is formed on a glass substrate, and TFT's are formed by means of the polysilicon. However, the material of the TFT's is not limited to one having crystallinity such as the polysilicon, but amorphous silicon can be also used.

A capacitor 17 is connected between the input-output first electrode and the control electrode of the TFT 11 (a first transistor). Moreover, the input-output second electrode of the TFT 11 is connected to the input-output first electrode of the TFT 12. The input-output second electrode of the TFT 12 is connected to the electrode on one side of the organic EL light emitting device 13. The electrode on the other side of the organic EL light emitting device 13 is connected to the common solid electrode connected to the second common electrode 609. On the other hand, two input-output electrodes of the TFT 4 (a second transistor) functioning as a switch are connected to the control electrode and the input-output second electrode of the TFT 11, respectively. Moreover, the input-output second electrode of the TFT 11 is connected to the input-output electrode on one side of the TFT 5 being a switch for switching the input electric current (idata) between the input thereof and the cut-off thereof. The input electric current (idata) is input through the input-output electrode on the other side of the TFT 5. The voltage of the control electrode of the TFT 4 is controlled by the scanning signal Vg1. Moreover, it is needed that the on states and the off states of the TFT 5 and the TFT 12 are different from each other. Accordingly, in the configuration of FIG. 3, the TFT's having a carrier polarity different from each other are used as the TFT 5 and the TFT 12, and thereby the voltages of the control electrodes of the TFT's 5 and 12 can be controlled by means of a single scanning signal Vg2.

Figure 4:
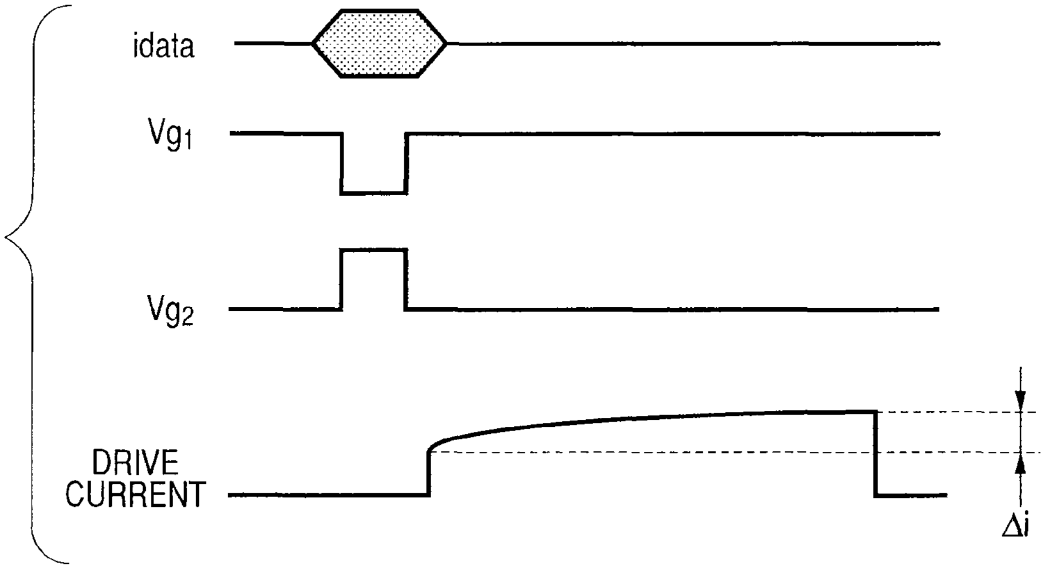
FIG. 4 is a diagram showing an operational timing of a light emitting device electric current drive circuit and a drive current value for illustrating the effect of the present invention.

Next, the operation of the drive circuit is described with the timing chart of FIG. 4 being also referred to. First, the luminance signal idata is set up. After that, the scanning signal Vg1 becomes a low level, and the p-channel type TFT 4 turns on. At the same time, the scanning signal Vg2 takes a high level, and then the n-channel type TFT 5 turns on to flow the electric current of the luminance signal idata through the TFT 11 between the source thereof and the drain thereof. Moreover, the turning of the scanning signal Vg2 to the high level turns the p-channel type TFT 12 off to cut off the electric current to the OEL 13.

During this period, the gate voltage of the TFT 11, through which the electric current of the luminance signal idata flows between the source and the drain, is accumulated in the capacitor 17. Consequently, when the scanning signal Vg1 being the gate voltage of the p-channel type TFT 4 is turned to the high level again as shown in FIG. 4 to turn the TFT 4 off, and when the scanning signal Vg2 being the gate voltage of the p-channel type TFT 12 is turned to the low level again to turn the TFT 12 on and to turn the TFT 5 off, an electric current 14, the amount of which is the same as that of the luminance signal idata, flows through the source and the drain of the TFT 11 from a power supply 15 for making the OEF 13 emit light.

By the above-mentioned series of operations, the p-channel type TFT 11 copies the luminance signal idata to perform a constant electric current operation.

Next, a leakage electric current of the TFT 4, which the drive circuit of the present invention aims to suppress, is described.

As described above, when the luminance signal idata flows through the TFT 11 between the source thereof and the drain thereof, the scanning signal Vg1 turns to the low lever, and the p-channel type TFT 4 turns on. When the gate voltage of the TFT 11 is accumulated in the capacitor 17, the TFT 4 is turned off. The voltage of the TFT 4 between the source thereof and the drain thereof at this time is TFT4_Vds=(Vdd−TFT11_Vgs−TFT12_Vds−OEL_V−Vcom), where TFT4_Vds denotes the voltage of the TFT 4 between the source thereof and the drain thereof, Vdd denotes the electric potential applied to the first common electrode 608, TFT11_Vgs denotes the voltage of the TFT 11 between the gate thereof and the source thereof, TFT12_Vds denotes the voltage of the TFT 12 between the source thereof and the drain thereof, OEL_V denotes the voltage of the OEL 13 between the anode thereof and the cathode thereof, and Vcom denotes the electric potential applied to the second common electrode 609.

Figure 5:
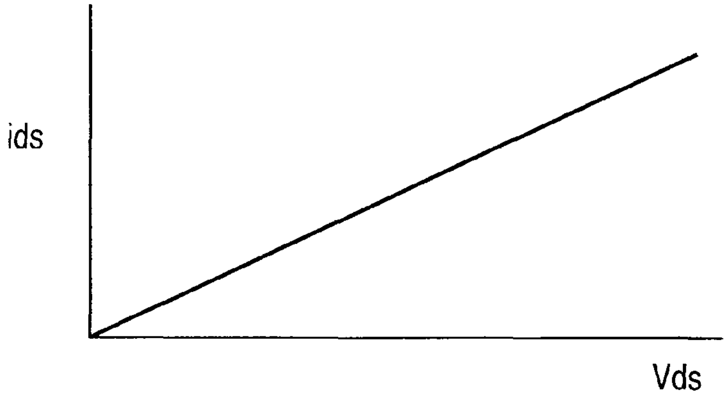
FIG. 5 is a diagram showing a relationship between a voltage and an electric current between a source and a drain in an off state of a transistor.

Now, the relationship between a voltage between a source and a drain of a transistor, and an electric current between the source and the drain of the transistor in the off state thereof shows the qualification as a graph in FIG. 5, and a leakage electric current flows without control of a gate electric potential. The charge of the holding capacitor 17 changes owing to the leakage electric current. As a result, the gate electric potential of the TFT 11 changes, and the electric current flowing through the OEL 17 changes according to the change of the gate electric potential of the TFT 11. Thereby, the luminance of the OEL 13 also changes. Consequently, as shown in FIG. 4, even when the scanning signal Vg2 is the low level, the drive electric current rises, and the luminance of the OEL 13 also rises as the rise of the drive electric current.

The state of the leakage electric current of the transistor for control 4 sometimes differs in every display unit to be manufactured. Accordingly, in the present embodiment, a prepared display unit is actually driven to emit light, and the luminance of the emitted light of the display device is measured. Then, the electric potential to be applied to the first common electrode 608 is adjusted in order that the variation of the luminance of the emitted light can be suppressed. To put it concretely, all white display is performed in the same condition as that at the time of actual image display, and the luminance of the all white display is measured with a photomultiplier for one frame. Then, the operation condition of a DC-DC converter being an adjustment circuit is adjusted to lower the electric potential to be applied to the first common electrode 608. Thereby, the leakage electric current of the transistor for control 4 is suitably suppressed.

Moreover, as another embodiment, a configuration in which the electric potential applied to the second common electrode 609 is adjusted can be adopted.

Moreover, as a further embodiment, the following configuration can be also adopted. That is, in the configuration, an electric potential is applied to a pixel circuit including a display device corresponding to a predetermined color through the first common electrode 608; an electric potential is applied to a pixel circuit including a display device corresponding to another predetermined color through a third common electrode; an electric potential is applied to a pixel circuit including a display device corresponding to further predetermined color through a fifth common electrode; the electric potential applied to the first electrode is set up as described above; the electric potential applied to the third electrode is also set up similarly; and the electric potential applied to the fifth electrode is also set up similarly. Incidentally, the electric potentials applied to the first, the third and the fifth common electrodes can suitably differed from each other according to each color display device.

Moreover, as a still further embodiment, the following configuration may be adopted. That is, in the configuration, the electric potential supplied from the second common electrode 609 to the other end of a display device is not applied to the whole pixel circuit through the common solid electrode, but is applied only to the pixel circuits including display devices of a predetermined color; the electric potential is applied to the pixel circuits including display devices of another predetermined color through a fourth common electrode; and the electric potential is applied to the pixel circuits including display devices of a further predetermined color through a sixth common electrode. In the configuration, the electric potentials to be applied to the second, the fourth and the sixth common electrodes can be set up similarly to the above.

In the following, each embodiment will be described more minutely.

EMBODIMENT 1

Figure 1:
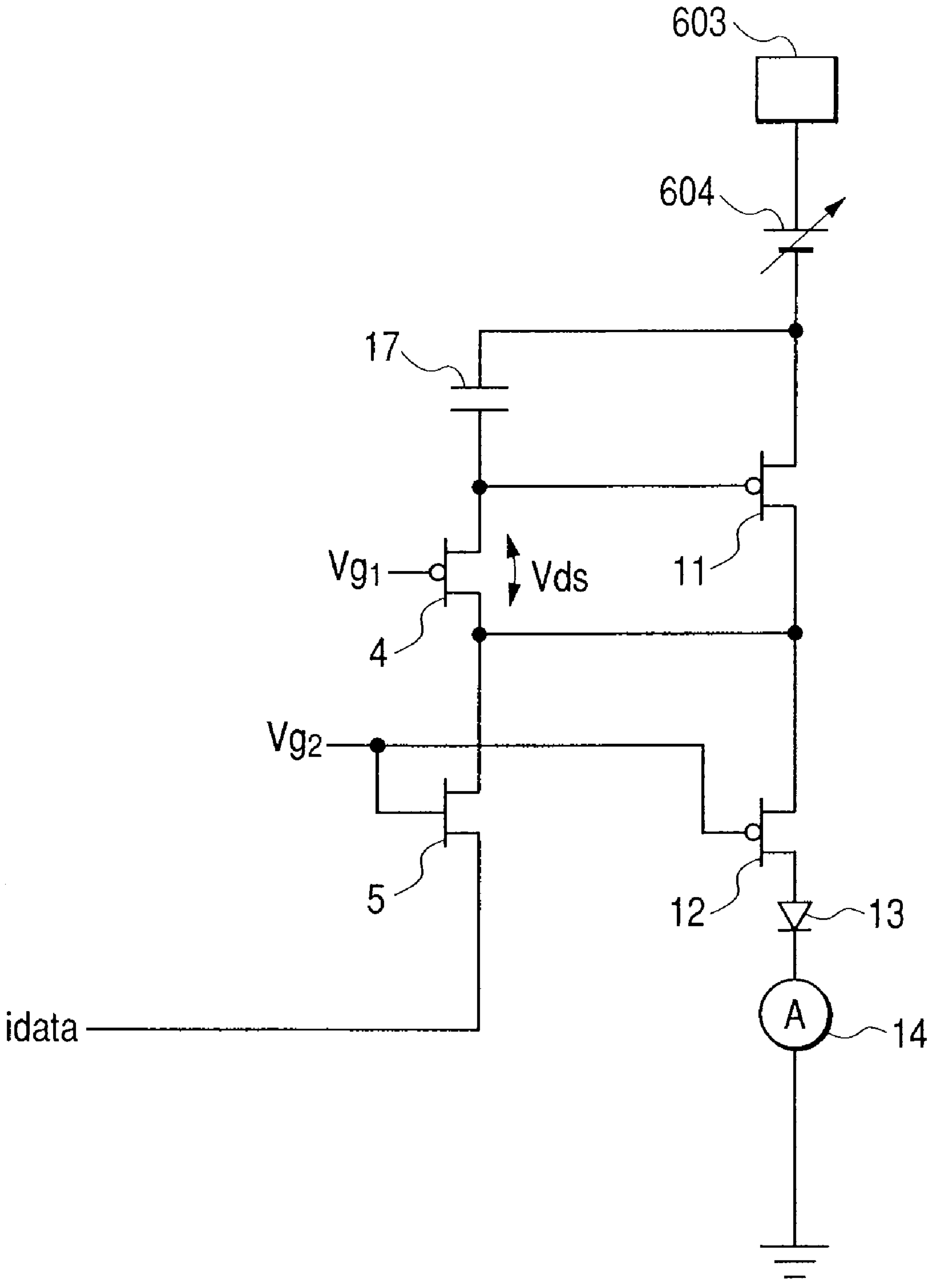
FIG. 1 is a schematic circuit diagram showing the configuration of an embodiment of the drive circuit of the present invention.

FIG. 1 is a view substantially equivalently showing a state of connecting a pixel circuit being the present embodiment, a power supply device being an electric potential source, a ground unit being an electric potential source, and a DC-DC converter being an adjustment circuit to each other.

In the light emitting device drive circuit of the present embodiment shown in FIG. 1, the voltage of the TFT 4 between the source thereof and the drain thereof is controlled by a DC-DC converter (shown as a variable voltage source) provided on the opposite side of the transistor for control 11 to the display device 13.

To put it more concretely, the DC-DC converter 604 controls the voltage of the TFT 4 between the source thereof and the drain thereof in order to satisfy OEL_V, i.e. the V-I characteristic of the OEL 13, which does not damage the constant electric current property of the OEL 13, and further in order to correct the increase of voltage at the time of the deterioration of the OEL 13. To put it concretely, the DC-DC converter 604 lowers the voltage TFT4_Vds by lowering the electric potential corresponding to the voltage Vdd of the formula TFT4_Vds=(Vdd−TFT11_Vgs−TFT12_Vds−OEL_V−Vcom) (by bringing the electric potential corresponding to the voltage Vdd near to the electric potential applied to the second common electrode 609).

At the time of the adjustment of the electric potential, the gate electric potential of the transistor for drive 11 is set up by performing electric current programming actually, and by making the OEL device 13 emit light on the basis of the programming to measure the luminance variation during one frame with a photomultiplier. The setting of the electric potential is performed to be able to suppress the luminance variation detected by the measurement.

Incidentally, one execution of the setting of the electric potential by means of the adjustment circuit at the manufacturing of the image display apparatus is sufficient, and the adjusted electric potential may be fixed. However, the adjustment may be performed by a user or a person in charge of maintenance of the image display apparatus as the need arises after the use of the image display apparatus for some periods.

By lowering the voltage of the TFT 4 between the source thereof and the drain thereof, the leakage electric current flowing through the transistor for control 4 between the principal electrodes thereof (or the source thereof and the drain thereof) can be suppressed. As a result, the variation of the gate electric potential of the TFT 11 can be suppressed at the time of a series of drive of the drive circuit having the form shown in FIG. 1, and thereby the variation of the electric current flowing through the OEL 13 can be suppressed. Consequently, the variation of the luminance of the OEL 13 can be suppressed.

In the drive circuit shown in FIG. 1, the luminance signal idata is first set up. After that, the scanning signal Vg1 turns to the low level, and the p-channel type TFT 4 turns on. At the same time, the scanning signal Vg2 turns to the high level, and the n-channel type TFT 5 turn on to flow the electric current of the luminance signal idata through the TFT 11 between the source thereof and the drain thereof.

Moreover, the p-channel type TFT 12 turns off at the change of the scanning signal Vg2 to the high level, and the TFT 12 cuts off the electric current to the OEL 13. During this period, the gate voltage of the TFT 11, through which the electric current of the luminance signal idata flows between the source thereof and the drain thereof, is accumulated in the capacitor 17. Then, the scanning signal Vg1 being the gate voltage of the p-channel type TFT 4 is again turned to the high level as shown in FIG. 4 to turn the TFT 4 off. Then, when the scanning signal Vg2 being the gate voltage of the p-channel type TFT 12 is turned to the low level again to turn the TFT 12 on and to turn the TFT 5 off, an electric current 14, the amount of which is the same as that of the luminance signal idata, flows through the source and the drain of the TFT 11 from the DC-DC converter 604 to the second common electrode 609 for making the OEF 13 emit light. At this time, the DC-DC converter 604 performs the adjustment for lowing the voltage of the TFT 4 between the source thereof and the drain thereof, and thereby, as described above, the voltage satisfying OEL_V, i.e. the V-I characteristic of the OEL 13, which does not damage the constant electric current property of the OEL 13, is applied to the series of devices of the TFT 11, TFT 4, TFT 12 and the OEL 13 with the consideration of the increase of voltage at the time of the deterioration of the OEL 13.

By the above-mentioned series of operations, the p-channel type TFT 11 copies the luminance signal idata to perform a constant electric current operation. Because the voltage of the TFT 4 between the source thereof and the drain thereof is suppressed to be low, the leakage electric current is suppressed, and the gate electric potential of the TFT 11 is kept to be constant, and also the electric current flowing through the OEL 13 can be kept to be constant. Consequently, the luminance of the OEL 13 can be kept to be constant while emitting light.

EMBODIMENT 2

In Embodiment 1, the configuration in which the adjustment circuit adjusts the electric potential to be applied to the principal electrode being not the one connected to the display device among the principal electrodes of the transistor for drive is shown. In the present embodiment, a configuration in which the adjustment circuit adjusts the electric potential applied to the opposite side of the transistor for drive to the side on which the transistor for drive is connected is adopted. To put it concretely, in FIG. 6, the adjustment circuit is arranged to adjust the electric potential to be applied to the first common electrode 608, but in the present embodiment, the adjustment circuit is arranged to adjust the electric potential to be applied to the second common electrode 609. To put it concretely, the adjustment circuit is provided between the ground unit being the second electric potential source and the common electrode to which the display device of each pixel circuit is commonly connected.

Figure 2:
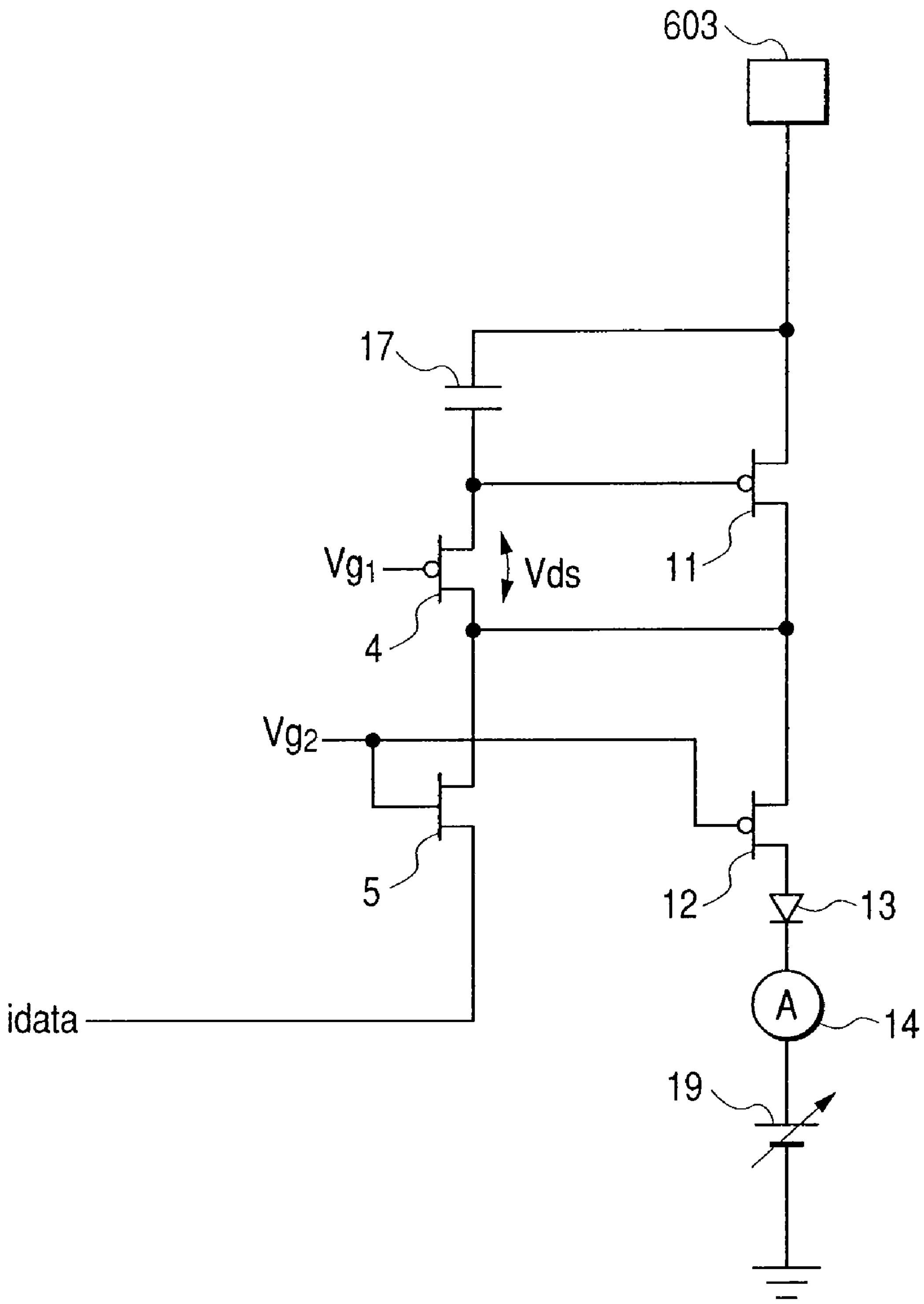
FIG. 2 is a schematic circuit diagram showing the configuration of another embodiment of the drive circuit of the present invention.

A schematic circuit diagram equivalently showing the configuration of the drive circuit of the present embodiment is shown in FIG. 2. As described above, the light emitting device drive circuit of the present embodiment controls the voltage of the TFT 4 between the source thereof and the drain thereof with the adjustment circuit (shown as a variable voltage source 19) provided on the second common electrode side.

The setting up of the electric potential of the adjustment circuit can be performed similarly to Embodiment 1. To put it concretely, the measurement of luminance is performed, and the electric potential is adjusted in order to suppress the variation of luminance.

To put it more concretely, the adjustment circuit provided on the side of the second common electrode 609 controls the voltage of the TFT 4 between the source thereof and the drain thereof in order that the voltage of the OEL 13 OEL_V which does not damage the constant property of the OEL 13 may be obtained, namely the V-I characteristic of the OEL 13 may be satisfied, with the increase of the voltage of the OEL 13 at the time of deterioration thereof being considered. The means raises the electric potential corresponding to the electric potential Vcom in the formula TFT4_Vds=(Vdd−TFT11_Vgs−TFT12_Vds−OEL_V−Vcom) (bringing the electric potential near to the electric potential applied to the first common electrode 608). Thereby, the voltage of the TFT 4 between the source thereof and the drain thereof is lowered.

By lowering the voltage of the TFT 4 between the source thereof and the drain thereof, the leakage electric current flowing through the TFT 4 between the source thereof and the drain thereof can be suppressed. As a result, at the time of a drive of the drive circuit having the form of FIG. 2, which will be described in the following, the variation of the gate electric potential of the TFT 11 can be suppressed, and the variation of the electric current flowing through the OEL 13 can be suppressed. Consequently, the variation of the luminance of the OEL 13 can be suppressed.

In the drive circuit shown in FIG. 2, first, the luminance signal idata is set up. After that, the scanning signal Vg1 becomes a low level, and the p-channel type TFT 4 turns on. At the same time, the scanning signal Vg2 takes a high level, and then the n-channel type TFT 5 turns on to flow the electric current of the luminance signal idata through the TFT 11 between the source thereof and the drain thereof. Moreover, the turning of the scanning signal Vg2 to the high level turns the p-channel type TFT 12 off to cut off the electric current to the OEL 13. During this period, the gate voltage of the TFT 11, through which the electric current of the luminance signal idata flows between the source thereof and the drain thereof, is accumulated in the capacitor 17. Then, when the scanning signal Vg1 being the gate voltage of the p-channel type TFT 4 is turned to the high level again as shown in FIG. 4 to turn the TFT 4 off, and when the scanning signal Vg2 being the gate voltage of the p-channel type TFT 12 is turned to the low level again to turn the TFT 12 on and to turn the TFT 5 off, an electric current 14, the amount of which is the same as that of the luminance signal idata, flows through the source and the drain of the TFT 11 from a power supply 15 to a variable voltage source 19 for making the OEF 13 emit light. At this time, the adjustment circuit lowers the voltage of the TFT 4 between the source thereof and the drain thereof according to the set gate voltage of the TFT 11 while controlling the voltage in order that the voltage OEL_V which does not damage the constant electric current property of the OEL 13, namely which satisfies the V-I characteristic of the OEL 13, may be applied to the serried of devices of the TFT 11, the TFT 14, the TFT 12 and the OEL 13, with the increase of the voltage of the OEL 13 at the time of the deterioration thereof being considered.

By the above-mentioned series of operations, the p-channel type TFT 11 copies the luminance signal idata to perform a constant electric current operation. Because the voltage of the TFT 4 between the source thereof and the drain thereof is suppressed to be low, the leakage electric current is suppressed, and the variation of the gate electric potential of the TFT 11 is suppressed, and also the variation of the electric current flowing through the OEL 13 can be suppressed.

EMBODIMENT 3

In Embodiment 1 and Embodiment 2, pixel circuits having the display devices corresponding to different colors are commonly connected to the first common electrode 608.

Now, the characteristics of the display devices sometimes differ from each other at every corresponding color. For example, in the case where the OEL 13 described above is made of a different organic material to each color, the voltage threshold value until the OEL 13 emits light and the electric current-voltage characteristic at the time of light emission differ in each color material. Consequently, the voltage Vds of the TFT 4 between the source thereof and the drain thereof changes according to the changes of the voltage threshold value and the electric current-voltage characteristic, and then the value of the leakage electric current also changes to each organic material. Moreover, the electric current-voltage characteristics of the R, the G and the B pixel materials also change owing to time degradation, and the way of the changes differs to each organic material.

Figure 8:
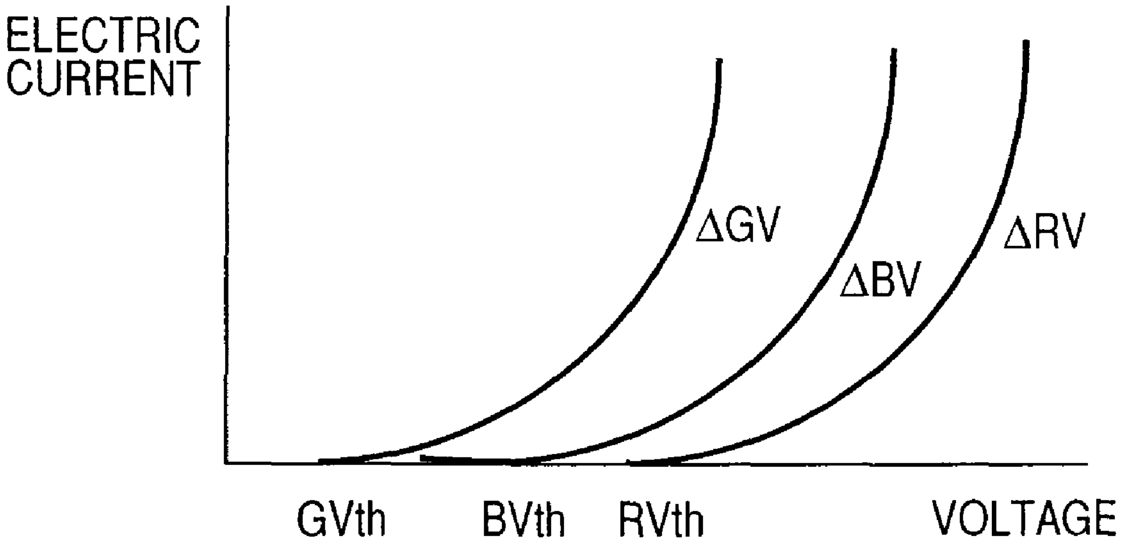
FIG. 8 is a diagram showing relationships between currents and voltages of organic EL devices having different characteristics.
Figure 9:
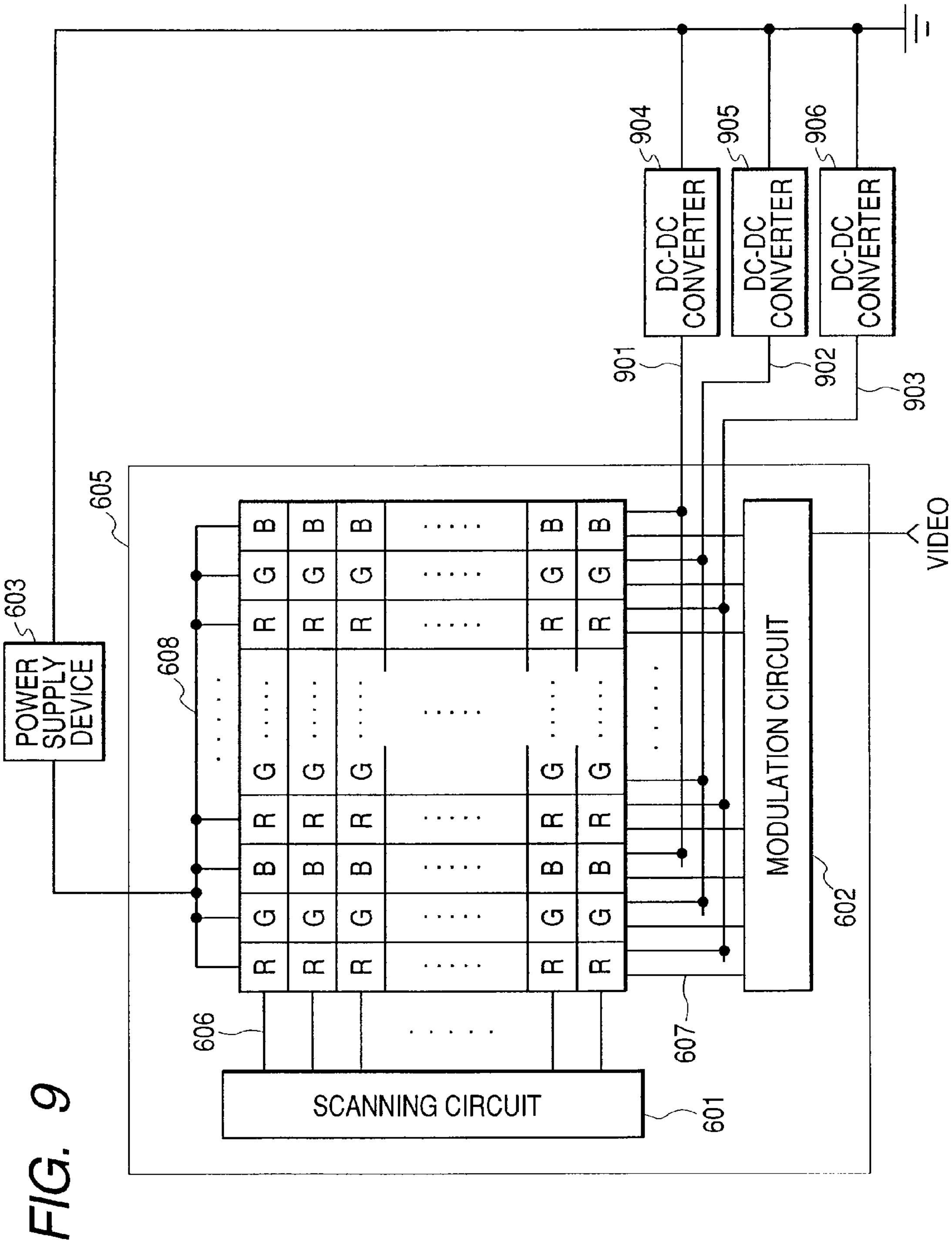
FIG. 9 is a diagram showing the configuration of the image display apparatus of further embodiment of the present invention.

Now, the reason why the voltage of a TFT between the source thereof and the drain thereof differ to each pixel circuit corresponding to each color is described on the basis of FIG. 8. As described above, the following formula is effective: TFT4_Vds=(Vdd−TFT11_Vgs−TFT12_Vds−OEL_V−Vcom). Consequently, when the voltage-electric current characteristic of each light emitting material of R, G and B differ from each other (or changes), the voltage of the TFT 4 between the source thereof and the drain thereof differs from each other (changes). The voltage-electric current characteristic of each of the R, the G and the B pixel materials is different from each other owing to the following primary factors and the like. In FIG. 8, GVth denotes a voltage at which an electric current begins to flow in a G pixel 1_2 material; BVth denotes a voltage at which an electric current begins to flow in a B pixel 1_3 material; RVth denotes a voltage at which an electric current begins to flow in a R pixel 1_1 material; ΔGV denotes an electric current increasing rate to a voltage in the G pixel 1_2 material; ΔBV denotes an electric current increasing rate to a voltage in the B pixel 1_3 material; and ΔRV denotes an electric current increasing rate to a voltage in the R pixel 1_1 material. Consequently, the voltages of the TFT's 4 between their sources and their drains of the drive circuits provided in the G pixel 1_2, the B pixel 1_3 and the R pixel 1_1 are different from each other in their initial states even at the same luminance. Moreover, the voltages of the TFT's 4 between their sources and their drains are different from each other also owing to the differences of ΔV's. Furthermore, the electric current-voltage characteristics of the R, the G and the B light emitting materials change also owing to time degradation.

In this case, as a configuration capable of more suitably suppressing the leakage electric currents between the sources and the drains of the TFT's 4 driving the light emitting devices having the different characteristics, a configuration of individually adjusting the electric potential applied to the pixel circuit corresponding to each color through the common electrode is preferable. Accordingly, the present embodiment adopts the following configuration. That is, a common electrode through which an electric potential is applied to a principal electrode being not one to which a display device is connected among the principal electrodes of a transistor for drive of each pixel circuit is provided to each color. Then, the electric potential to be applied to the common electrode of each color is individually adjusted.

The portions common in those of Embodiment 1 and Embodiment 2 are denoted by the same marks as those of Embodiment 1 and Embodiment 2.

The points different from those of Embodiment 1 and Embodiment 2 are as follows. That is, in Embodiment 1 and Embodiment 2, the pixel circuits corresponding to different colors are commonly connected to the first common electrode 608. In the present embodiment, a plurality of pixel circuits corresponding to red is commonly connected to a first common electrode 704; a plurality of pixel circuits corresponding to green is commonly connected to a third common electrode 705; and a plurality of pixel circuits corresponding to blue is commonly connected to a fifth common electrode 706. Moreover, an electric potential is applied to the first common electrode 704 through a DC-DC converter 701 being an adjustment circuit for adjusting the electric potential output from the power supply device 603; an electric potential is applied to the third common electrode 705 through a DC-DC converter 702 for adjusting the electric potential output from the power supply device 603; and an electric potential is applied to the fifth common electrode 706 through a DC-DC converter 703 for adjusting the electric potential output from the power supply device 603. The output electric potential of each adjustment circuit is individually adjusted.

To put it concretely, display of red is performed by driving the pixel circuits corresponding to red, and the luminance is measured. Then, the output electric potential of the adjustment circuit 701 is adjusted in order to suppress the luminance variation of red in a period of a frame. Next, only the pixel circuits corresponding to green are driven to perform the display of green, and the luminance measurement thereof is performed. Then, the output electric potential of the adjustment circuit 702 is adjusted in order to suppress the luminance variation of green in a period of a frame. Next, only the pixel circuits corresponding to blue are driven to perform the display of blue, and the luminance measurement thereof is performed. Then, the output electric potential of the adjustment circuit 703 is adjusted in order to suppress the luminance variation of blue in a period of a frame.

Thereby, the electric potentials to be applied to the transistors for drive can be adjusted to each color.

EMBODIMENT 4

Figure 7:
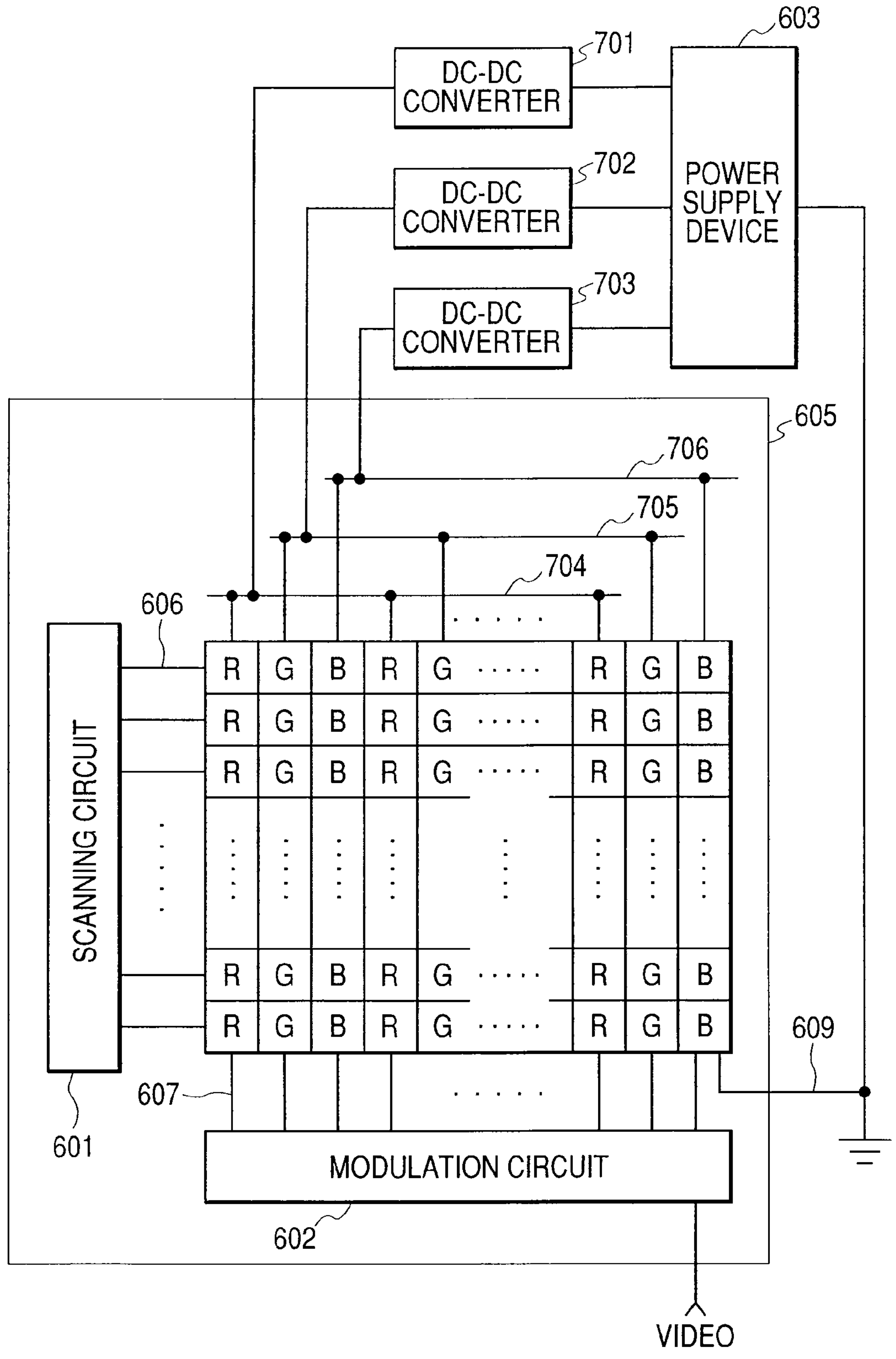
FIG. 7 is a diagram showing the configuration of the image display apparatus of another embodiment of the present invention.

In Embodiment 3, the configuration in which the electric potentials applied to the principal electrodes being not ones to which the display devices are connected among the principal electrodes of the transistors for drive are adjusted by the adjustment circuits provided to respective colors is shown. In the present embodiment, a configuration in which the electric potentials applied to the sides of the display devices opposite to ones on which the transistors for drive are connected are adjusted by the adjustment circuits is adopted. To put it concretely, in FIG. 7, the plurality of adjustment circuits are arranged to adjust the electric potential to be applied to the first common electrode 704, the third common electrode 705 and the fifth common electrode 706, respectively. However, in the present embodiment, the adjustment circuits for respective colors are arranged to adjust the electric potentials on the opposite sides of the display devices to the ones on which the transistors for drive are connected. Although an electric potential can be applied commonly to all of the pixel circuits through the second common electrode 609 in Embodiment 1, Embodiment 2 and Embodiment 3 described above, the cathode electrodes of the display devices are arranged to respective colors in the present embodiment.

Then, the cathode electrodes of the display devices of a plurality of pixel circuits corresponding to red are commonly connected to a second common electrode 903; the cathode electrodes of the display devices of a plurality of pixel circuits corresponding to green are commonly connected to a fourth common electrode 902; and the cathode electrodes of the display devices of a plurality of pixel circuits corresponding to blue are commonly connected to a sixth common electrode 901. Moreover, an electric potential is applied to the second common electrode 903 from a DC-DC converter 906 being an adjustment circuit for adjusting the electric potential output from the ground unit; an electric potential is applied to the fourth common electrode 902 from a DC-DC converter 905 for adjusting the electric potential output from the ground unit; and an electric potential is applied to the sixth common electrode 901 from a DC-DC converter 904 for adjusting the electric potential output from the ground unit. The output electric potential of each adjustment circuit is individually adjusted. The concrete method of the adjustment is the same as that of Embodiment 3.

Incidentally, each embodiment has been described above. The configuration shown in FIG. 10 can be used as the configurations of the scanning circuit 601 and the modulation circuit 602 described with regard to each embodiment.

Figure 10:
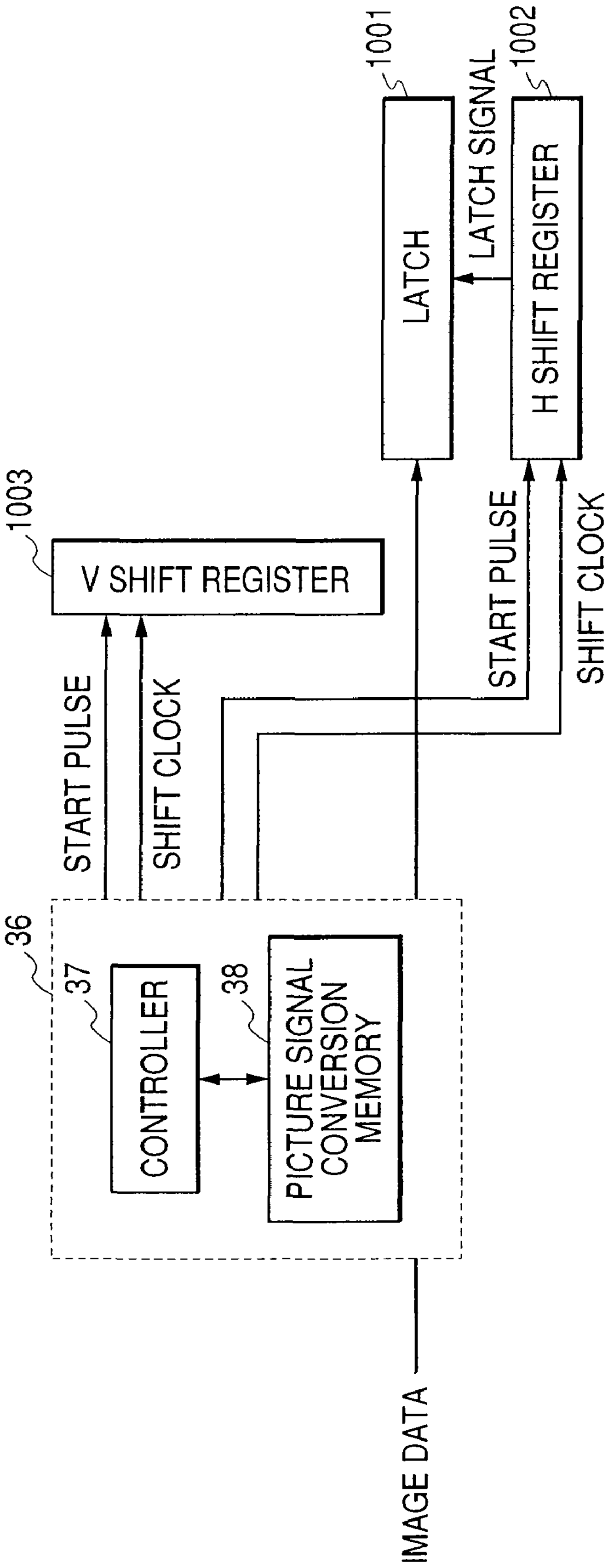
FIG. 10 is a diagram showing the configuration of a scanning circuit and a modulation circuit used in the embodiments.

FIG. 10 shows a V shift register 1003 constituting the scanning circuit 601, an H shift register 1002 constituting the modulation circuit 602, and a latch 1001. A scanning signal is applied to the scanning signal wiring from the V shift register 1003, and a modulation signal is applied to the modulation signal wiring from the latch 1001. A display control unit 36 includes a controller 37 and a picture signal conversion memory 38. Image data and a timing control signal, if necessary, are input into the display control unit 36, and the display control unit inputs a timing signal such as a shift pulse and a start pulse, and a video signal into the scanning circuit 601 and the modulation circuit 602.

What is claimed is:

1. An image display apparatus including a display unit and a voltage source, the display unit having display devices and pixel circuits, each of the pixel circuits being provided with:

a drive transistor which has a first primary electrode connected to one terminal of each of the display devices, a second primary electrode connected to a first common electrode, and a control electrode for controlling by an electric potential the magnitude of a drive current supplied to the display devices; and a control transistor which has a source electrode and a drain electrode connected to the control electrode and the first primary electrode, respectively, and a gate electrode to which a signal switching between an on-state and an off-state is supplied, with an electric potential of the control electrode being set up at the on-state, wherein the voltage source is a voltage source which can adjust a voltage applied between the first common electrode and a second common electrode with another terminal of the display device being connected thereto.

2. The image display apparatus according to claim 1, wherein the voltage source is adjustable in a direction of decreasing a voltage between the source electrode and the drain electrode in the off-state of the control transistor.

3. The image display apparatus according to claim 1, wherein the voltage source is adjustable considering a voltage between the terminals of the display device.

4. An image display apparatus including a color display unit and a voltage source, wherein the color display unit has first display devices turning a first color, second display devices turning a second color, first pixel circuits for driving the first display devices, and second pixel circuits for driving the second display devices, wherein each of the first pixel circuits is provided with:

a first drive transistor which has a first primary electrode connected to one terminal of the first display device, a second primary electrode connected to a first common electrode, and a control electrode for controlling by an electric potential the magnitude of a drive current supplied to the first display device; and a first control transistor which has a source electrode and a drain electrode connected to the control electrode and the first primary electrode, respectively, of the first drive transistor, and a gate electrode to which a signal switching between an on-state and an off-state is supplied, the first control transistor setting up an electric potential of the control electrode of the first drive transistor in the on-state, and each of the second pixel circuits is provided with:

a second drive transistor which has a first primary electrode connected to one terminal of the second display element, a second primary electrode connected to a third common electrode, and a control electrode for controlling by an electric potential the magnitude of a drive current supplied to the second display device; and a second control transistor which has a source electrode and a drain electrode connected to the control electrode and the first primary electrode, respectively, on the second drive transistor, and a gate electrode to which a signal switching between an on-state and an off-state is supplied, the second control transistor setting up an electric potential of the control electrode of the second drive transistor in the on-state, wherein the voltage source is a voltage source which can individually adjust a voltage applied between the first common electrode and a second common electrode with another terminal of the first display device being connected thereto and individually adjust a voltage applied between the third common electrode and a fourth common electrode with another terminal of the second display device being connected thereto.

* * * * *